(12) United States Patent
Matsuo et al.

(10) Patent No.: US 12,379,427 B2
(45) Date of Patent: Aug. 5, 2025

(54) ELECTRICAL APPARATUS AND REFRIGERATION CYCLER

(71) Applicant: Mitsubishi Electric Corporation, Tokyo (JP)

(72) Inventors: Haruka Matsuo, Tokyo (JP); Koichi Arisawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 18/580,441

(22) PCT Filed: Feb. 21, 2023

(86) PCT No.: PCT/JP2023/006247
§ 371 (c)(1),
(2) Date: Jan. 18, 2024

(87) PCT Pub. No.: WO2024/176355
PCT Pub. Date: Aug. 29, 2024

(65) Prior Publication Data
US 2025/0076406 A1    Mar. 6, 2025

(51) Int. Cl.
G01R 31/52    (2020.01)
G01R 31/67    (2020.01)

(52) U.S. Cl.
CPC .............. *G01R 31/52* (2020.01); *G01R 31/67* (2020.01)

(58) Field of Classification Search
CPC ......... G01R 31/52; G01R 31/67; G01R 31/54
See application file for complete search history.

(56) References Cited

U.S. PATENT DOCUMENTS 4,329,643 A * 5/1982 Neumann .......... G01R 31/2827
340/514
5,768,077 A * 6/1998 Futsuhara .............. G01R 31/54
361/42

(Continued)

FOREIGN PATENT DOCUMENTS

JP    S62-43576 A    2/1987
JP    H04-026851 U    3/1992

(Continued)

OTHER PUBLICATIONS

Written Opinion of the International Searching Authority mailed Apr. 18, 2023 issued in corresponding International Patent Application No. PCT/JP2023/006247 (and English translation).

(Continued)

*Primary Examiner* — Lee E Rodak
*Assistant Examiner* — Demetrius R Pretlow
(74) *Attorney, Agent, or Firm* — Posz Law Group, PLC

(57)    ABSTRACT

An electrical apparatus includes: a substrate on which circuit components of a power converter are mounted, and to which a power supply voltage is applied from an alternating-current power supply; a housing accommodating the substrate; a current detector; and a controller. The current detector detects a physical quantity correlated with a common mode current, the common mode current flowing to circulate through at least two of the alternating-current power supply, the substrate, and the housing by power generated by the power converter. The controller senses whether an electrical wire that is a ground wire is connected or not, on the basis of a value detected by the current detector.

9 Claims, 11 Drawing Sheets

(56) References Cited

U.S. PATENT DOCUMENTS

| | | | | |
|---|---|---|---|---|
| 5,949,197 A | * | 9/1999 | Kastner | H05B 41/2851 |
| | | | | 315/307 |
| 2010/0052419 A1 | | 3/2010 | Oosawa et al. | |
| 2011/0067435 A1 | * | 3/2011 | Kaneko | F25B 40/00 |
| | | | | 62/498 |
| 2015/0346258 A1 | * | 12/2015 | Haeuslein | G01R 31/52 |
| | | | | 324/509 |
| 2018/0203054 A1 | * | 7/2018 | Romero | G01R 31/007 |
| 2020/0096549 A1 | | 3/2020 | Myo | |
| 2024/0264242 A1 | * | 8/2024 | Hemmer | G01R 19/0038 |

FOREIGN PATENT DOCUMENTS

| | | | | |
|---|---|---|---|---|
| JP | H08-184626 A | | 7/1996 | |
| JP | 2006-250782 A | | 9/2006 | |
| JP | 2008096106 A | * | 4/2008 | G01R 31/025 |
| JP | 2010-54468 A | | 3/2010 | |
| WO | 2008/044593 A1 | | 4/2008 | |
| WO | 2014/102954 A1 | | 7/2014 | |
| WO | 2019/123673 A1 | | 6/2019 | |
| WO | 2022/118450 A1 | | 6/2022 | |

OTHER PUBLICATIONS

International Search Report of the International Searching Authority mailed Apr. 18, 2023 issued International Patent Application No. PCT/JP2023/006247.

* cited by examiner

ELECTRICAL APPARATUS AND REFRIGERATION CYCLER

CROSS REFERENCE TO RELATED APPLICATION

This application is a U.S. national stage application of PCT/JP2023/006247 filed on Feb. 21, 2023, the contents of which are incorporated herein by reference.

FIELD

The present disclosure relates to an electrical apparatus having a function of sensing ground wire connection, and a refrigeration cycler.

BACKGROUND

An electrical apparatus is accommodated in a housing so as to protect circuit components. In addition, the housing accommodating the electrical apparatus is basically grounded by an electrical wire. An electrical wire for grounding is referred to as a ground wire. Current may leak outside the housing through an unintended path, however it supposed that there is no safety problem with the electrical apparatus as long as a power supply is grounded by the ground wire. However, there is a possibility that the ground wire does not work properly due to deterioration of the ground wire or a terminal to which the ground wire is connected, a defect in wiring work for installing electrical wires including the ground wire, or the like. Assuming such a case, a leakage current circuit breaker is conventionally inserted between a power supply and an electrical apparatus so as to safely disconnect the electrical apparatus. Meanwhile, since the leakage current circuit breaker is an essential constituent element, this conventional technique is disadvantageous in that manufacturing cost increases.

In addition, Patent Literature 1 below discloses a technique including a high-frequency generation circuit that generates a high-frequency voltage and checks whether a ground wire is properly connected by intentionally causing a high-frequency current to flow through the ground wire.

CITATION LIST

Patent Literature

Patent Literature 1: Japanese Patent Application Laid-open No. 2006-250782

SUMMARY OF INVENTION

Problem to be Solved by the Invention

However, the technique of Patent Literature 1 has a problem in that since it is necessary to additionally provide the high-frequency generation circuit solely for checking whether the ground wire is connected, manufacturing cost increases and cost effectiveness is low. In addition, when there is an anomaly in the high-frequency generation circuit, there is a possibility that the connection status of the ground wire cannot be accurately sensed, and there is also a possibility that an unintended excessive voltage may be applied to circuit components of an electrical apparatus.

The present disclosure has been made in view of the above, and an object of the present disclosure is to provide an electrical apparatus capable of accurately and reliably sensing the connection status of a ground wire of the electrical apparatus while suppressing an increase in manufacturing cost.

Means to Solve the Problem

To solve the above problems and achieve the object an electrical apparatus according to the present disclosure has a function of sensing whether a ground wire is connected or not. The electrical apparatus includes: a substrate on which circuit components of a power converter configured to perform power conversion are mounted, and to which a power supply voltage is applied from a power supply; a housing configured to accommodate the substrate; a detector configured to detect a physical quantity correlated with a common mode current, the common mode current flowing to circulate through at least two of the power supply, the substrate, and the housing by power generated by the power converter; and a sensor configured to sense whether the ground wire is connected or not, on a basis of a value detected by the detector.

Effects of the Invention

The electrical apparatus according to the present disclosure has the effect of accurately and reliably sensing the connection status of the ground wire of the electrical apparatus while suppressing an increase in manufacturing cost.

DESCRIPTION OF EMBODIMENTS

Hereinafter, electrical apparatuses and a refrigeration cycler according to embodiments of the present disclosure will be described in detail with reference to the accompanying drawings. Note that, in the following description, physical connection and electrical connection are simply referred to as "connection" without being distinguished from each other. That is, the term "connection" refers to both a case where constituent elements are directly connected to each other and a case where the constituent elements are indirectly connected to each other via another constituent element. Furthermore, a case where an electrical apparatus is installed in a refrigeration cycler will be hereinafter described as an example, but the present disclosure is not limited to this example. That is, the technique of the present disclosure is also applicable to electrical apparatuses to be installed in apparatuses other than refrigeration cyclers.

First Embodiment

Figure 1:
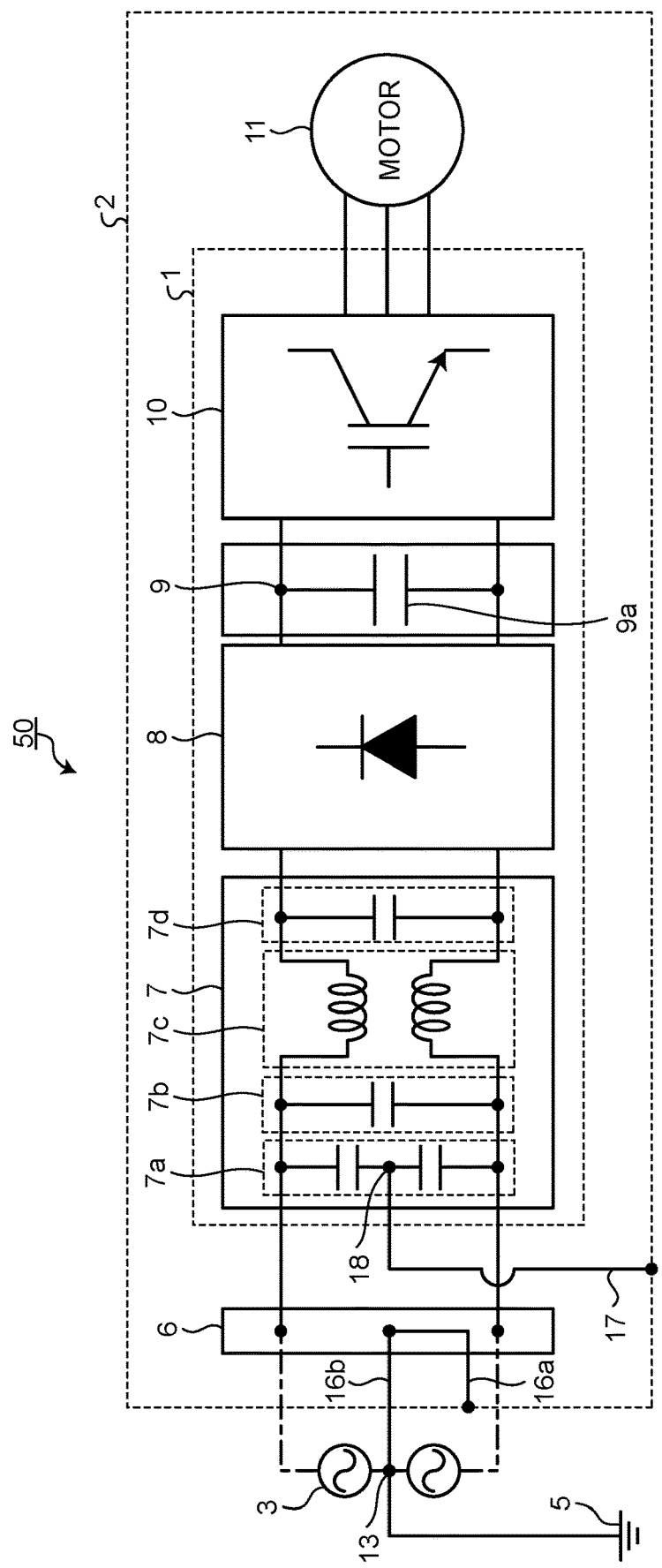
FIG. 1 is a diagram illustrating a configuration example of an electrical apparatus according to a first embodiment.

FIG. 1 is a diagram illustrating a configuration example of an electrical apparatus 50 according to a first embodiment. As illustrated in FIG. 1, the electrical apparatus 50 according to the first embodiment includes a terminal block 6, a noise filter circuit 7, a rectifier circuit 8, a smoother 9, an inverter circuit 10, and a motor 11. The noise filter circuit 7, the rectifier circuit 8, the smoother 9, and the inverter circuit 10 form a power converter that performs power conversion. Circuit components of the power converter are mounted on a substrate 1. The substrate 1, the terminal block 6, and the motor 11 are accommodated in a housing 2. The smoother 9 includes a capacitor 9a as a smoothing element. The rectifier circuit 8 is a bridge circuit including, for example, four rectifier elements. The inverter circuit 10 is a three-phase bridge circuit including, for example, six semiconductor switching elements.

FIG. 1 illustrates the electrical apparatus 50 serving as an outdoor unit of a refrigeration cycler, in which the motor 11 is a compressor drive motor. Note that although not illustrated, a fan drive motor is connected to the inverter circuit 10 in parallel with the motor 11. Furthermore, illustration of a relay circuit, a control power supply circuit, and the like is also omitted in FIG. 1.

The terminal block 6 is connected to an alternating-current power supply 3 serving as power supplies. A midpoint 13 of the alternating-current power supply 3 is connected to an earth ground 5. The housing 2 and the terminal block 6 are connected by an electrical wire 16a. The terminal block 6 and the midpoint 13 of the alternating-current power supply 3 are connected by an electrical wire 16b. As a result, the potential of the housing 2 becomes equal to a ground potential which is the potential of the earth ground 5. Thus, the housing 2 is connected to the earth ground 5. In the present specification, the electrical wire 16a may be referred to as a "first grounding conductor", and the electrical wire 16b may be referred to as a "ground wire". Note that although FIG. 1 illustrates the alternating-current power supply 3 that is alternating-current power supply of a single-phase three-wire system, the alternating-current power supply 3 of the present embodiment is not limited to this example. The alternating-current power supply 3 may be an alternating-current power supply of a single-phase two-wire system, or may be alternating-current power supply of a three-phase three-wire system or a three-phase four-wire system.

The noise filter circuit 7 includes: a first circuit portion 7a including two line bypass capacitors connected in series; a second circuit portion 7b including an across-the-line capacitor, and is disposed at a subsequent stage of the first circuit portion 7a; a third circuit portion 7c including two common mode choke coils, and is disposed at a subsequent stage of the second circuit portion 7b; and a fourth circuit portion 7d including an across-the-line capacitor, and is disposed at a subsequent stage of the third circuit portion 7c. The line bypass capacitor is also referred to as a "Y-capacitor", and the across-the-line capacitor is also referred to as an "X-capacitor". In the first circuit portion 7a, the housing 2 and a connection point 18 between the two Y-capacitors are connected by an electrical wire 17. As a result, the connection point 18 is electrically connected to the housing 2, and the potential of the connection point 18 becomes equal to the ground potential. In the present specification, the electrical wire 17 may be referred to as a "second grounding conductor".

A power supply voltage is applied to the substrate 1 from the alternating-current power supply 3 via the terminal block 6. The power supply voltage is applied to the rectifier circuit 8 via the noise filter circuit 7. The power supply voltage is rectified by the rectifier circuit 8, and the rectified voltage is smoothed by the smoother 9. The smoothed direct-current voltage is converted into an alternating-current voltage having a desired voltage value and a desired frequency by the inverter circuit 10, and is applied to the motor 11 connected to an output end of the inverter circuit 10. As a result, the motor 11 is driven. The noise filter circuit 7 removes noise input from the alternating-current power supply 3 side. In addition, the noise filter circuit 7 removes high-frequency noise generated when the inverter circuit 10 performs switching operation.

Figure 2:
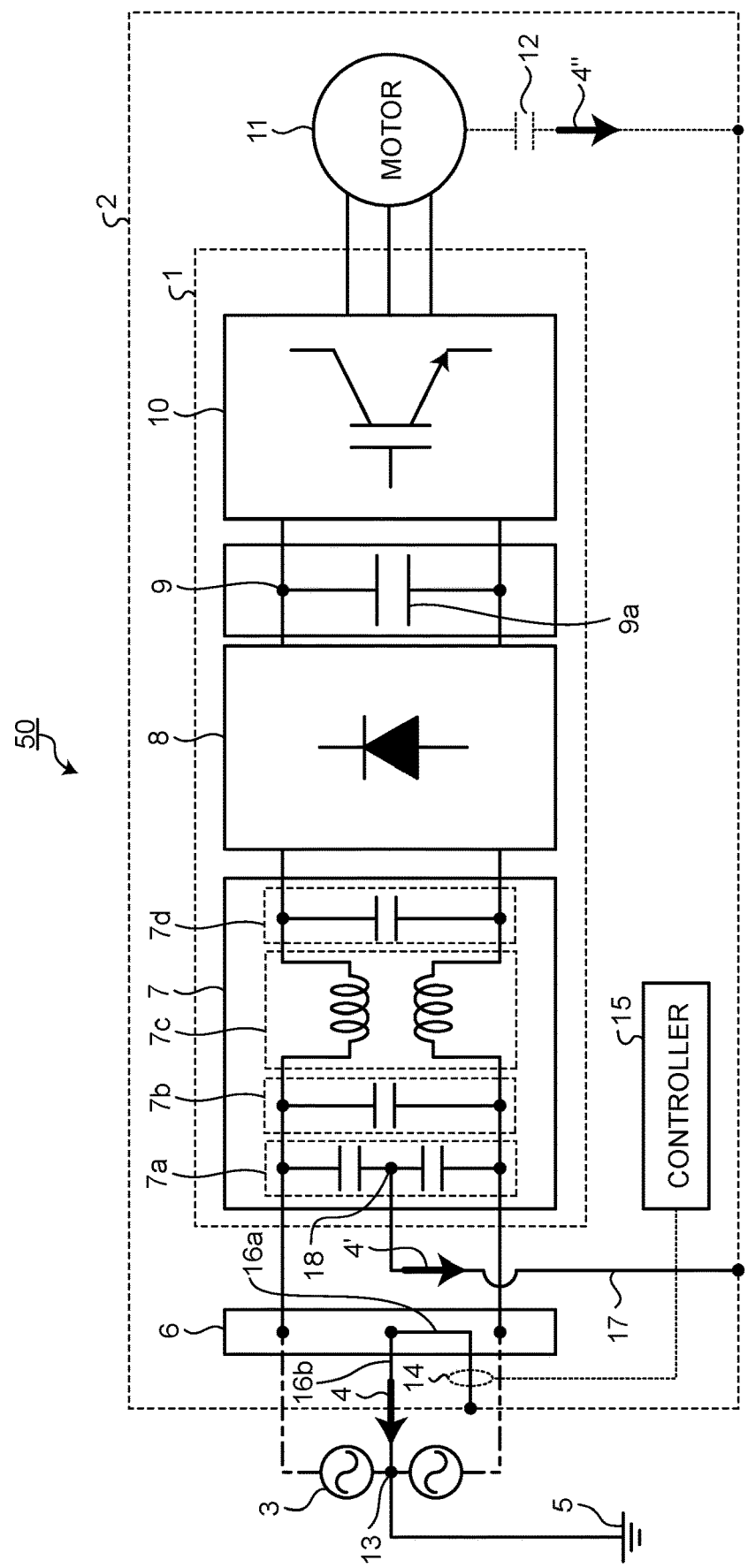
FIG. 2 is a diagram for describing operation of the electrical apparatus according to the first embodiment.

Next, main points of operation to be performed in the electrical apparatus 50 according to the first embodiment will be described with reference to FIG. 2. FIG. 2 is a diagram for describing operation of the electrical apparatus 50 according to the first embodiment. In FIG. 2, a current detector 14 and a controller 15 are additionally illustrated as constituent parts for sensing whether the electrical wire 16b serving as a ground wire is connected in the electrical apparatus 50 illustrated in FIG. 1. The current detector 14 is a sensor that detects a current flowing through the electrical wire 16a. Some sensors of this type detects a current by converting the current into a voltage or a magnetic field, but any sensor may be used as long as the sensor can detect a current flowing through the electrical wire 16a. That is, the current detector 14 is a detector that detects a physical quantity correlated with the current flowing through the electrical wire 16a. A value detected by the current detector 14 is input to the controller 15.

When the inverter circuit 10 performs switching operation, the inverter circuit 10 generates electric power. At this time, the inverter circuit 10 serves as a power supply. Thus, common mode currents 4, 4', and 4" flow as illustrated. The common mode current 4 is a current flowing through the electrical wire 16b which is a ground wire. The electrical wire 16b is an electrical wire to be installed when an installer performs wiring work. Therefore, if there is any error in the wiring work, the common mode current 4 does not flow. In addition, the common mode current 4 does not flow also in a case where, for example, an installation portion of the terminal block 6, to which the electrical wire 16b is connected, is loosened over time to cause the connection status of the electrical wire 16b to be unstable even if the common mode current 4 flowed at the time of installation of the electrical wire 16b.

In addition, the common mode current 4' is a current flowing through the electrical wire 17 which is the second grounding conductor. The current flowing through the electrical wire 17 is a current flowing between the substrate 1 and the housing 2. Furthermore, the common mode current 4" is a current flowing via a parasitic capacitor 12 located between the motor 11 and the housing 2.

The common mode current 4 is a sum of a plurality of common mode currents including the common mode current 4' and the common mode current 4". When the electrical wire 16b is not connected, or when the connection status of the electrical wire 16b is poor, the common mode current 4 does not flow through the electrical wire 16b.

Therefore, in the first embodiment, the current detector 14 detects a current flowing through the electrical wire 16a which is the first grounding conductor. The amount of current flowing through the electrical wire 16a is equal to the amount of current flowing through the electrical wire 16b. Since the current flowing through the electrical wire 16a is small, it is possible to use the current detector 14 that is small in size and capacity. In addition, since the current detector 14 just needs to be capable of detecting whether current flows through the electrical wire 16b, a current detector designed for current of any frequency band including frequency components may be used. Thus, an inexpensive current sensor may be used as the current detector 14.

Note that while the common mode current 4, the common mode current 4', and the common mode current 4" are all currents flowing through the housing 2, there is also a plurality of common mode currents flowing through parasitic capacitors and other grounding conductors in a portion not illustrated. Examples of the other grounding conductors include a grounding conductor that grounds a heat sink for cooling the switching elements included in the inverter circuit 10.

Current flowing through the grounding conductor that grounds the heat sink flows between the substrate 1 and the alternating-current power supply 3 serving as power supply, without involving the housing 2. Therefore, the current detector 14 just needs to be disposed such that it is possible to detect a common mode current flowing in such a way as to circulate through at least two of the alternating-current power supply 3, the substrate 1, and the housing 2. An example in which the current detector 14 is disposed so as to detect a current flowing between the housing 2 and the alternating-current power supply 3 has been described in the first embodiment. Meanwhile, another arrangement example will be described in a second embodiment below.

Figure 3:
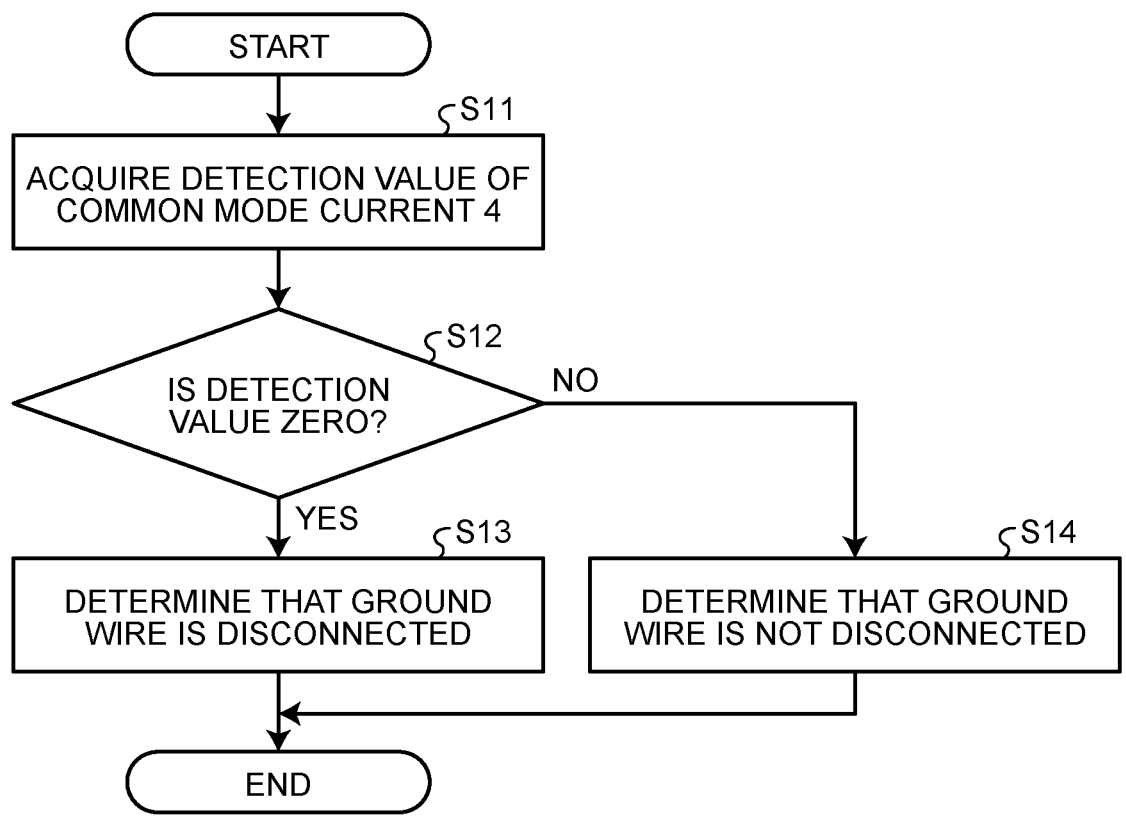
FIG. 3 is a flowchart for describing a method for sensing the connection status of a ground wire in the electrical apparatus according to the first embodiment.

Next, a description will be given of a method for sensing ground wire connection in the electrical apparatus 50 according to the first embodiment. FIG. 3 is a flowchart for describing a method for sensing the connection status of the ground wire in the electrical apparatus 50 according to the first embodiment.

The controller 15 acquires a detection value of the common mode current 4 from the current detector 14 (step S11). The controller 15 determines whether the detection value of the common mode current 4 is zero (step S12). With regard to the detection value of the common mode current 4, the term "zero" mentioned here also refers to a value that is substantially zero, that is, a value that is not exactly zero but is considered zero. When the detection value of the common mode current 4 is zero (step S12, Yes), the controller 15 determines that the ground wire is disconnected (step S13). Meanwhile, when the detection value of the common mode current 4 is not zero (step S12, No), the controller 15 determines that the ground wire is not disconnected (step S14).

As described above, the controller 15 operates as a sensor configured to sense whether the ground wire is connected or not, on the basis of a value detected by the current detector 14. When the value detected by the current detector 14 is zero, the controller 15 is configured to: determine that the ground wire is disconnected; cause the electrical apparatus 50 to stop operation; or provide a user or an administrator with warning information to the effect that the electrical apparatus 50 is anomalous by notifying the user or the administrator of an anomaly in the electrical apparatus 50 or displaying information on the anomaly in the electrical apparatus 50. Note that a warning to the effect that there is an anomaly may be provided by, for example, buzzer sound, lighting of a lamp, or information shown on a display of a remote controller. In addition, in a case where the electrical apparatus 50 is communicably connected to an information terminal such as a smartphone, notification of the anomaly may be provided to the information terminal. Furthermore, in a case where the electrical apparatus 50 is an air conditioner which is communicably connected to a management company via the Internet, notification of the anomaly may be provided to the management company.

Note that, in a case where the electrical apparatus 50 has a structure in which current flows through the electrical wire 16b not only while the electrical apparatus 50 is in operation but also while the electrical apparatus 50 is not in operation, whether the ground wire is connected or not is determined even while the electrical apparatus 50 is not in operation.

Figure 4:
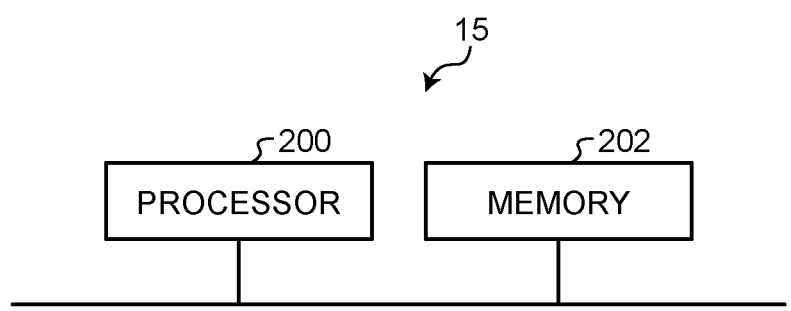
FIG. 4 is a diagram illustrating an example of a hardware configuration that implements a function of a controller included in the electrical apparatus according to the first embodiment.

The controller 15 may be configured as illustrated in FIG. 4. FIG. 4 is a diagram illustrating an example of a hardware configuration that implements a function of the controller 15 included in the electrical apparatus 50 according to the first embodiment. The function of the controller 15 is implemented by a processor 200 and a memory 202.

The processor 200 is a central processing unit (CPU, also referred to as a processing device, an arithmetic device, a microprocessor, a microcomputer, a processor, or a digital signal processor (DSP)) or a system large-scale integration (LSI). The memory 202 is exemplified by nonvolatile or volatile semiconductor memories such as a random access memory (RAM), a read only memory (ROM), a flash memory, an erasable programmable read only memory (EPROM), and an electrically erasable programmable read only memory (EEPROM (registered trademark)). Furthermore, the memory 202 is not limited thereto, and may be a magnetic disk, an optical disk, a compact disk, a mini disk, or a digital versatile disc (DVD).

Note that the rectifier circuit 8 forming the power converter in the electrical apparatus 50 illustrated in FIGS. 1 and 2 has been described as a bridge circuit including, for example, four rectifier elements, but the configuration of the rectifier circuit 8 is not limited to this configuration. For example, the rectifier circuit 8 may be configured as illustrated in FIGS. 5 to 8. FIGS. 5 to 8 are diagrams illustrating configurations of first to fourth modifications of the power converter provided inside the electrical apparatus 50 according to the first embodiment. In FIGS. 5 to 8, the power converter in the electrical apparatus 50 is illustrated as a power converter 100. Furthermore, constituent parts equivalent to those illustrated in FIGS. 1 and 2 are denoted by the same reference numerals in FIGS. 5 to 8. Moreover, illustration of the terminal block 6 and the noise filter circuit 7 is omitted in FIGS. 5 to 8.

Figure 5:
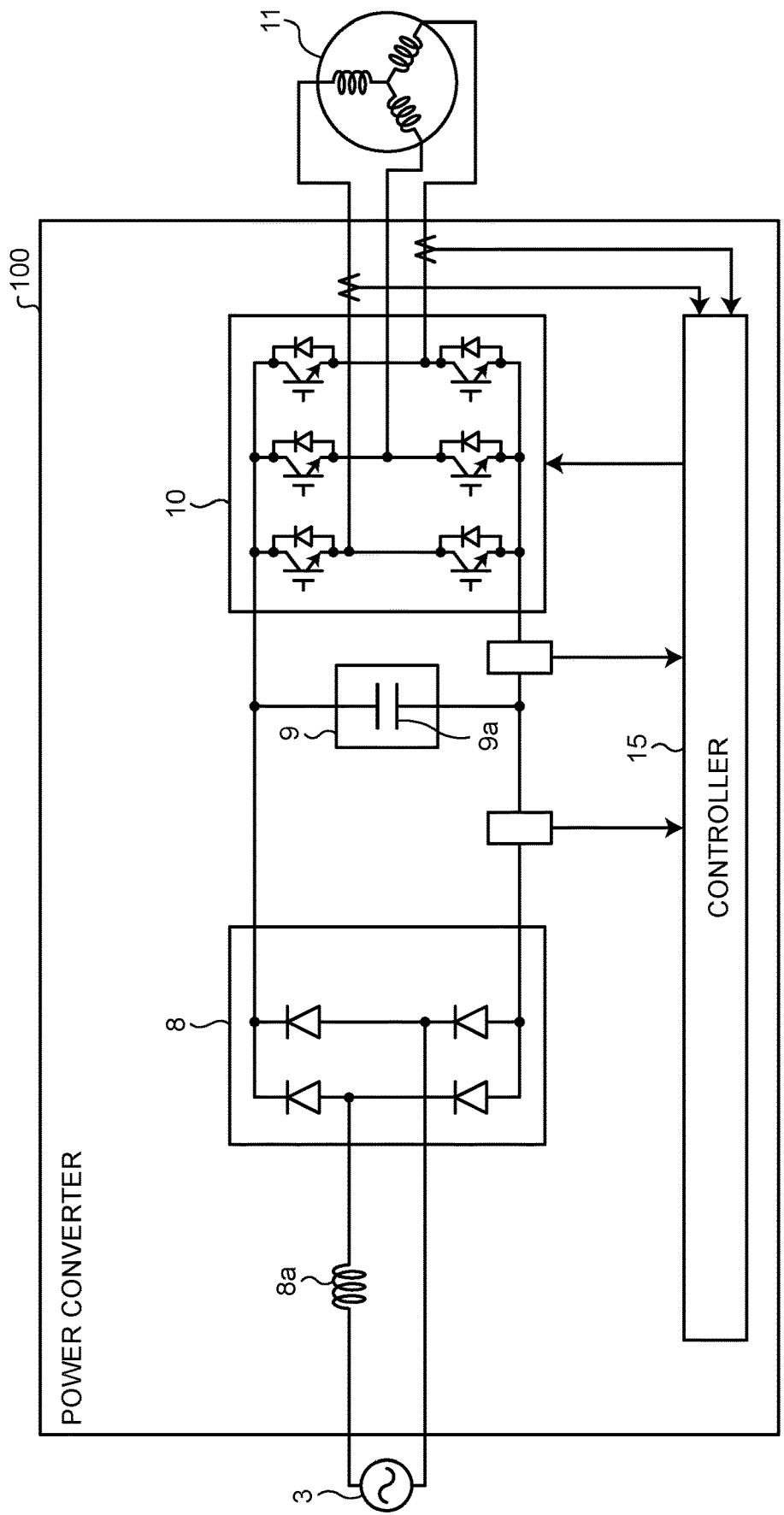
FIG. 5 is a diagram illustrating a configuration of a first modification of a power converter provided inside the electrical apparatus according to the first embodiment.
Figure 6:
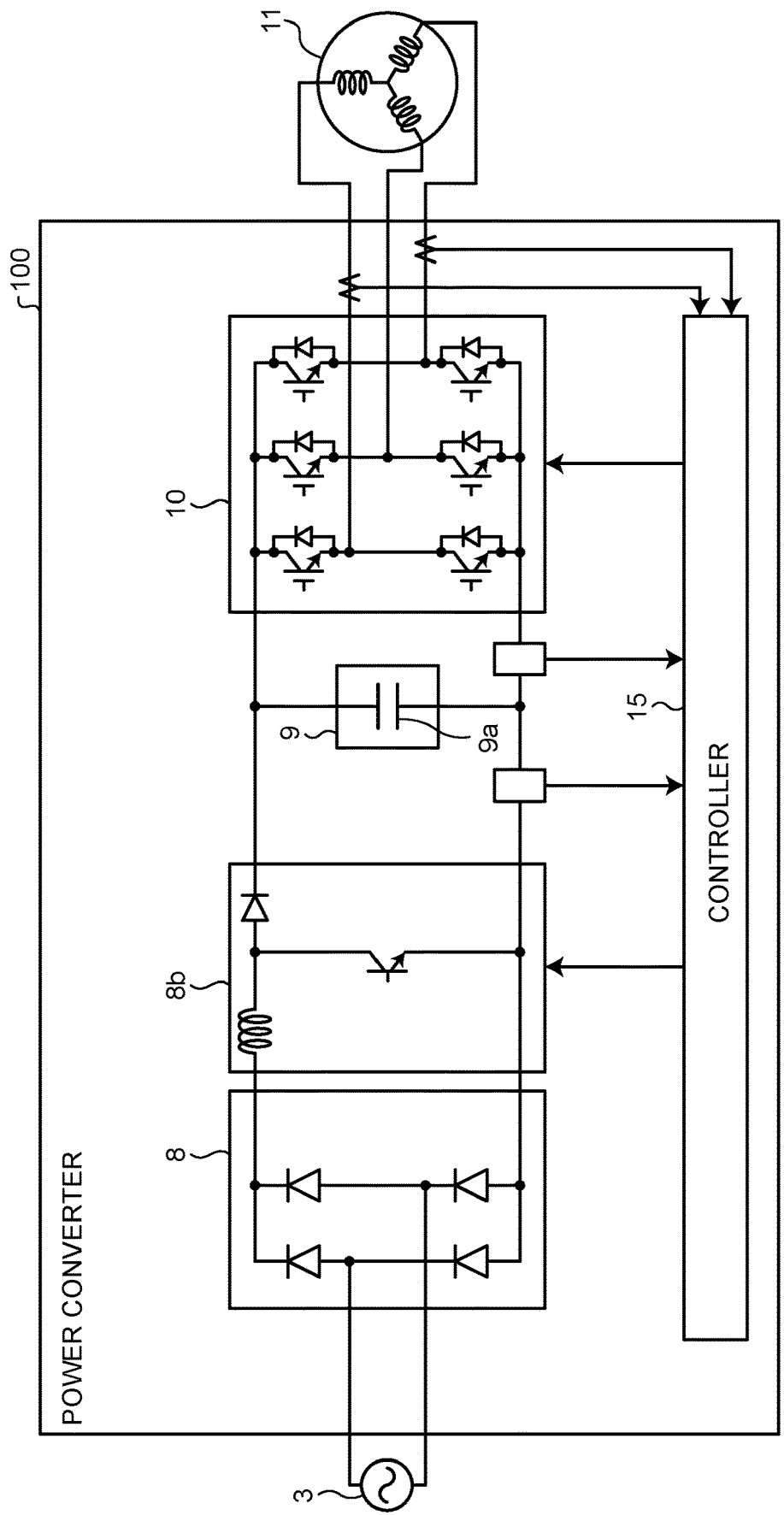
FIG. 6 is a diagram illustrating a configuration of a second modification of the power converter provided inside the electrical apparatus according to the first embodiment.
Figure 7:
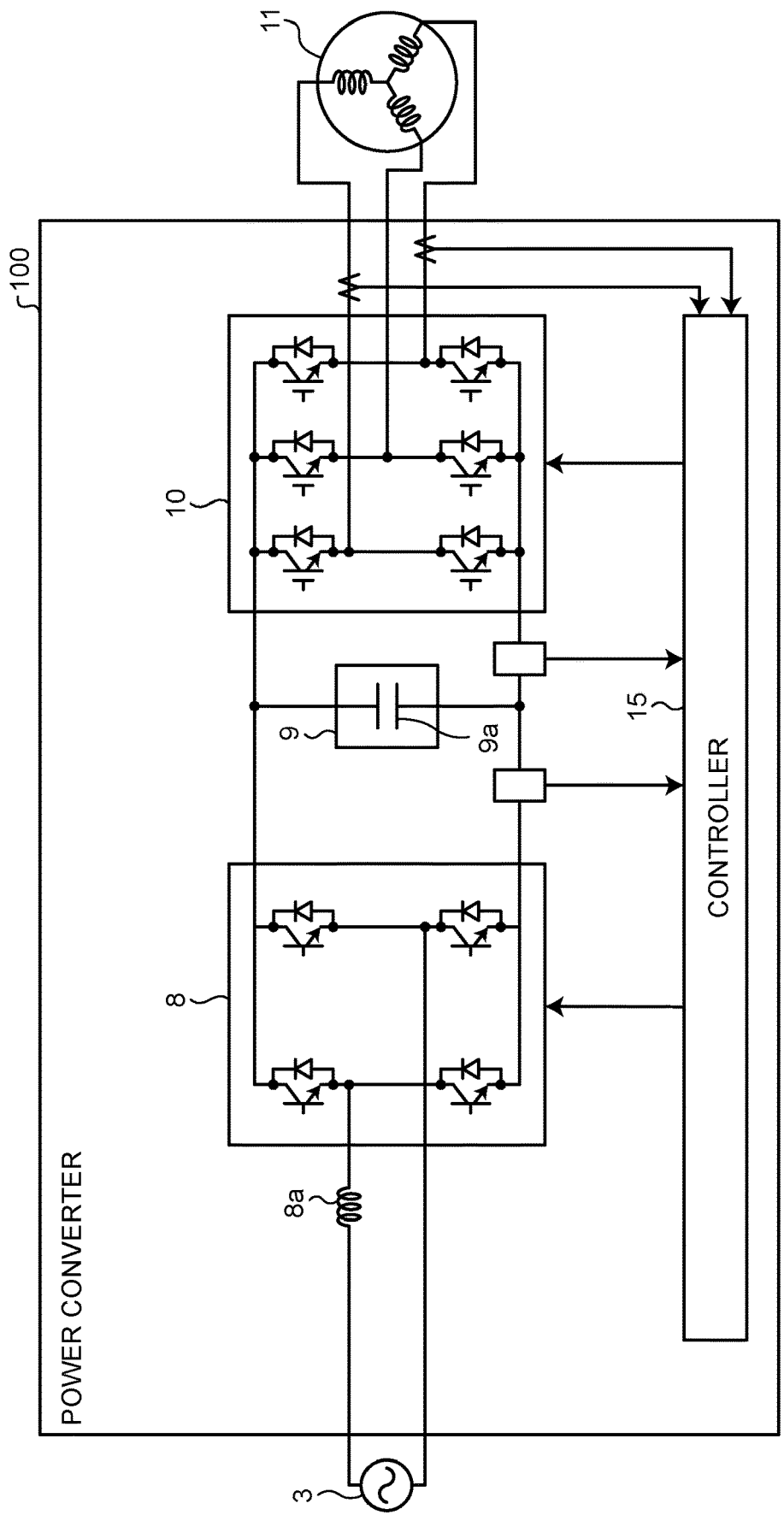
FIG. 7 is a diagram illustrating a configuration of a third modification of the power converter provided inside the electrical apparatus according to the first embodiment.
Figure 8:
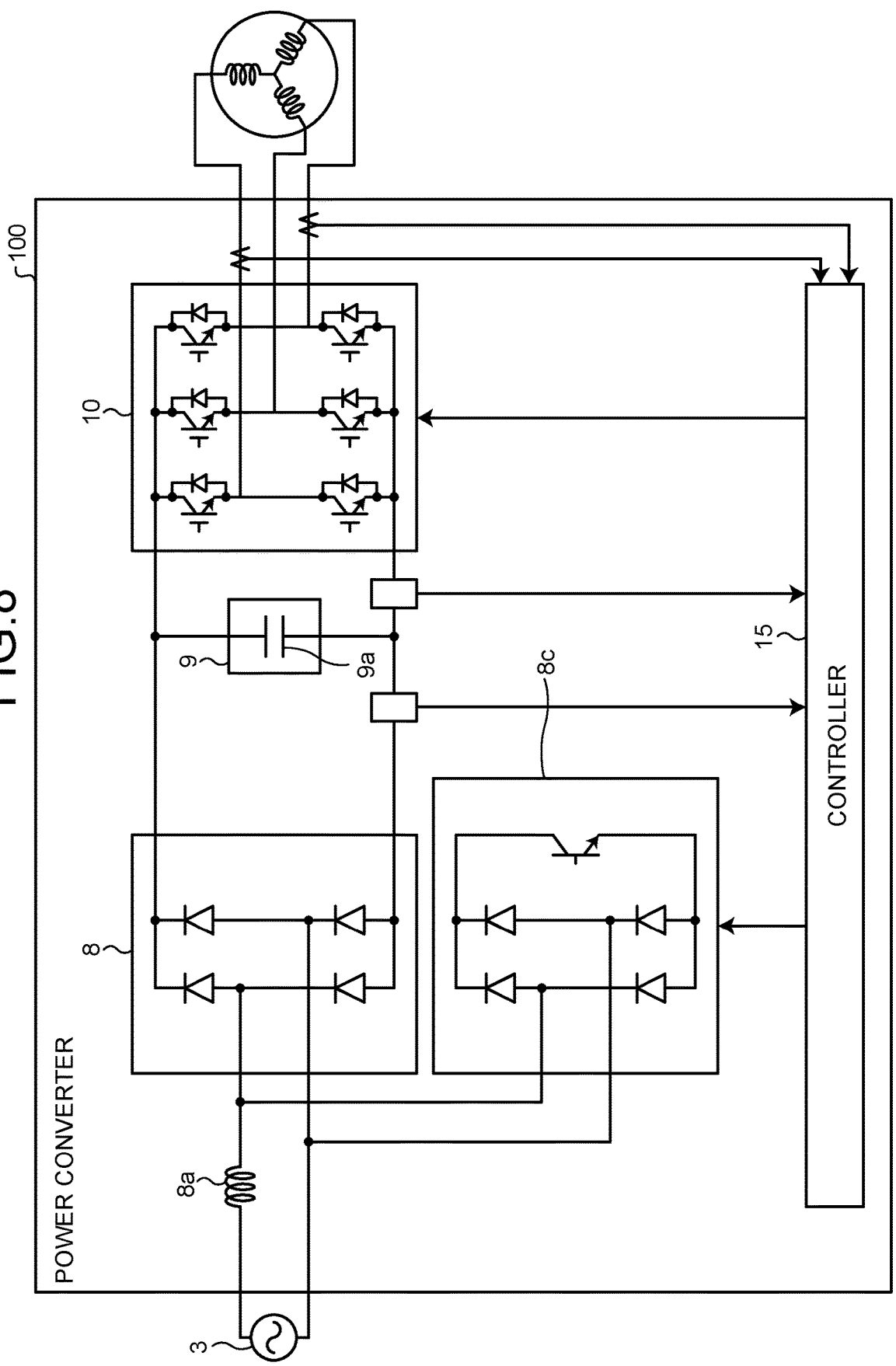
FIG. 8 is a diagram illustrating a configuration of a fourth modification of the power converter provided inside the electrical apparatus according to the first embodiment.

As illustrated in FIG. 5, a reactor 8a may be inserted between the alternating-current power supply 3 and the rectifier circuit 8. In addition, a booster circuit 8b may be provided between the rectifier circuit 8 and the smoother 9 as illustrated in FIG. 6. Furthermore, as illustrated in FIG. 7, the reactor 8a may be inserted between the alternating-current power supply 3 and the rectifier circuit 8, and the four rectifier elements included in the rectifier circuit 8 may be switching elements. Moreover, as illustrated in FIG. 8, a short circuit 8c for short-circuiting power supply voltage to be applied to the rectifier circuit 8 may be provided between the reactor 8a and the rectifier circuit 8.

As described above, the electrical apparatus according to the first embodiment is an electrical apparatus having a function of sensing whether a ground wire is connected or not. The electrical apparatus includes: a substrate on which a circuit component of a power converter that performs power conversion is mounted, and to which a power supply voltage is applied from a power supply; and a housing configured to accommodate the substrate. In addition, the electrical apparatus includes: a detector configured to detect a physical quantity correlated with a common mode current, the common mode current flowing to circulate through at least two of the power supply, the substrate, and the housing by power generated by the power converter; and a sensor configured to sense whether the ground wire is connected or not, on the basis of a value detected by the detector. The electrical apparatus according to the first embodiment configured as described above eliminates the need for a leakage current circuit breaker that may be provided in the conventional technique. In addition, the electrical apparatus according to the first embodiment eliminates the need for an additional circuit such as a high-frequency generation circuit required in the conventional technique. It is thus possible to prevent occurrence of a failure event in which the connection status of the ground wire cannot be accurately sensed due to an anomaly in the additional circuit. This makes it possible to obtain an electrical apparatus capable of accurately and reliably sensing the connection status of a ground wire of the electrical apparatus while suppressing an increase in manufacturing cost.

In addition, the electrical apparatus according to the first embodiment includes a first grounding conductor configured to electrically connect the housing and the power supply. The detector is configured to detect a physical quantity correlated with current flowing through the first grounding conductor. The housing accommodates a terminal block that receives a power supply voltage, and applies the power supply voltage to the substrate. The first grounding conductor is disposed in such a way as to electrically connect the housing and the power supply via the terminal block. With such a configuration, the electrical apparatus according to the first embodiment accurately and reliably senses the connection status of the ground wire of the electrical apparatus.

Furthermore, when a value detected by the detector is zero, the electrical apparatus according to the first embodiment stops operation, or provides notification to the effect that the electrical apparatus is anomalous. As a result, the electrical apparatus safely stops, and information on the failure in ground wire connection is provided to the user or the administrator.

Second Embodiment

Figure 9:
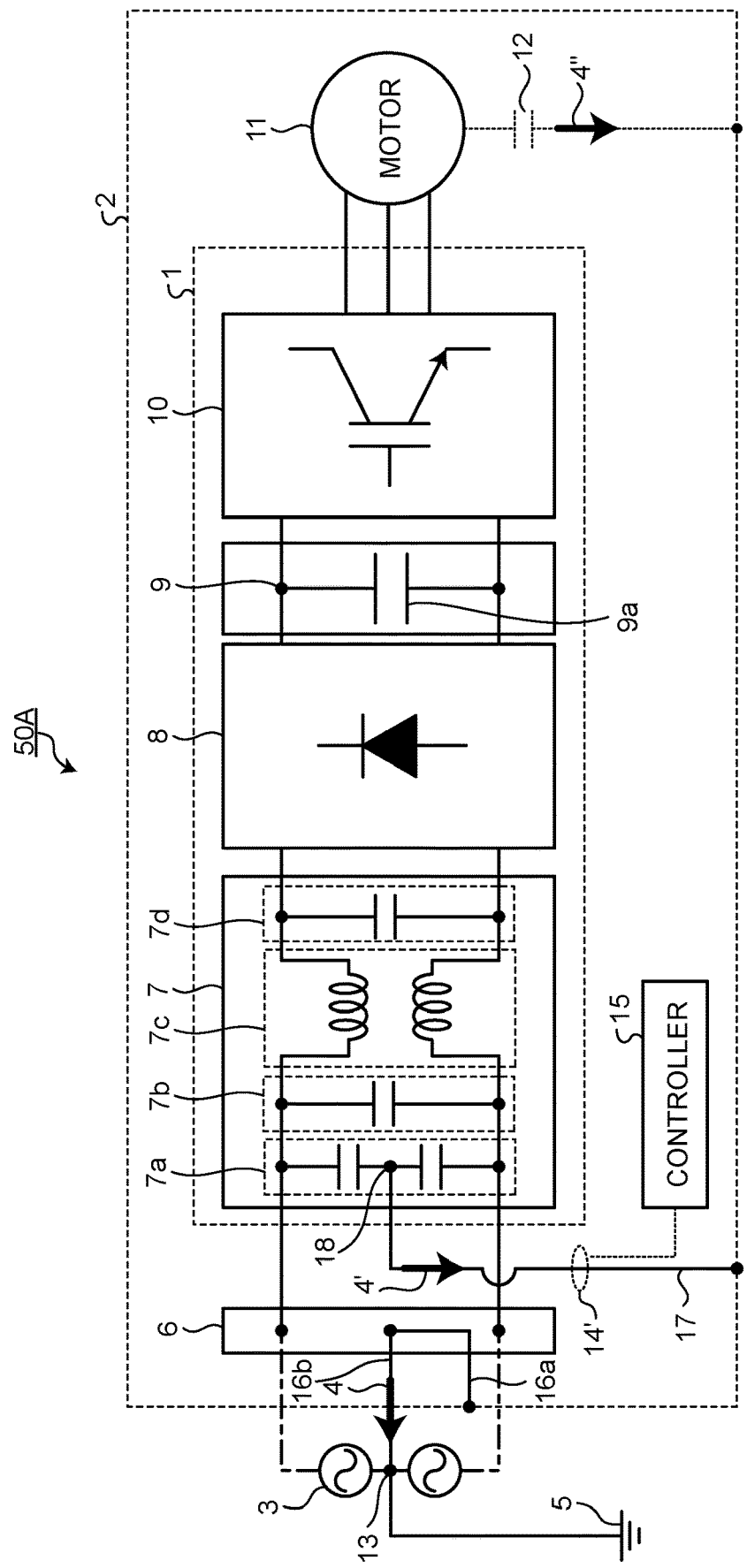
FIG. 9 is a diagram illustrating a configuration example of an electrical apparatus according to a second embodiment.

FIG. 9 is a diagram illustrating a configuration example of an electrical apparatus 50A according to a second embodiment. The electrical apparatus 50A illustrated in FIG. 9 is configured as follows. The current detector 14 disposed on the electrical wire 16a has been removed from the configuration of the electrical apparatus 50 illustrated in FIG. 2, and instead, a current detector 14' is disposed on the electrical wire 17 which is the second grounding conductor. Except for this point, the configuration of the electrical apparatus 50A is the same as or equivalent to the configuration illustrated in FIG. 2. Thus, the same or equivalent constituent elements are denoted by the same reference numerals, and redundant description will be omitted.

The current detector 14' is a sensor configured to detect a current flowing between the housing 2 and the connection point 18 between the two Y-capacitors, that is, a current flowing between the housing 2 and the substrate 1. Some sensors of this type detects a current by converting the current into a voltage or a magnetic field, but any sensor may be used as long as the sensor can detect a current flowing through the electrical wire 17. That is, the current detector 14' is a detector configured to detect a physical quantity correlated with the current flowing through the electrical wire 17. A value detected by the current detector 14' is input to the controller 15.

The common mode current 4' to be detected by the current detector 14' is different from, but part of, the common mode current 4 flowing between the housing 2 and the alternating-current power supply 3. When the electrical wire 16b serving as a ground wire is not connected, when the connection status of the electrical wire 16b is poor, or when the connection status of the electrical wire 16b has been impaired, the common mode current 4 does not flow through the electrical wire 16b. In this case, the common mode current 4' flows on another path that does not pass through the electrical wire 16b, and a current that would have flowed through the electrical wire 16b is added to the common mode current 4'. As a result, the common mode current 4' increases. However, it is also assumed that the common mode current 4' decreases depending on a change in the capacitance of the parasitic capacitor 12. In either case, if a correlation between the common mode current 4 and the common mode current 4' is examined in advance, the common mode current 4' may be indirectly used to estimate the common mode current 4.

Figure 10:
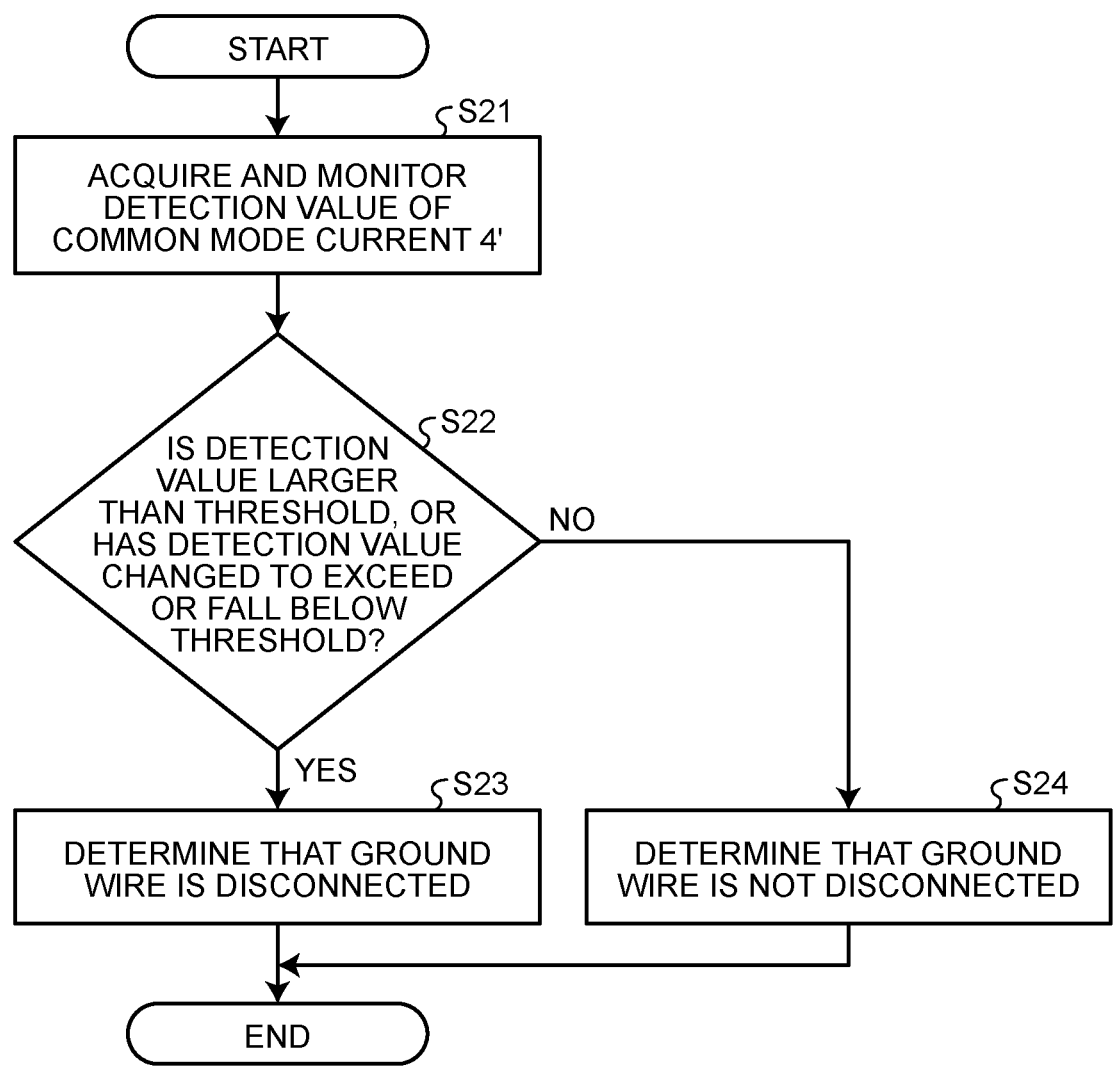
FIG. 10 is a flowchart for describing a method for sensing the connection status of a ground wire in the electrical apparatus according to the second embodiment.

Next, a description will be given of a method for sensing ground wire connection in the electrical apparatus 50A according to the second embodiment. FIG. 10 is a flowchart for describing a method for sensing the connection status of the ground wire in the electrical apparatus 50A according to the second embodiment.

The controller 15 acquires a detection value of the common mode current 4' from the current detector 14', and monitors the detection value (step S21). The controller 15 determines whether the detection value of the common mode current 4' is larger than a threshold, or has changed to exceed or fall below the threshold (step S22). The threshold is determined on the basis of the correlation between the common mode current 4 and the common mode current 4' examined in advance. When the detection value of the common mode current 4' is larger than the threshold, or when the detection value of the common mode current 4' has changed to exceed or fall below the threshold (step S22, Yes), the controller 15 determines that the ground wire is disconnected (step S23). Furthermore, when the detection value of the common mode current 4' is not larger than the threshold, and has not changed to exceed or fall below the threshold (step S22, No), the controller 15 determines that the ground wire is not disconnected (step S24).

As described above, the controller 15 operates as a sensor that senses whether the ground wire is connected, on the basis of a value detected by the current detector 14'. When the value detected by the current detector 14' is larger than the threshold, the controller 15 determines that the ground wire is disconnected, and causes the electrical apparatus 50A to stop operation, or provide a user or an administrator with warning information to the effect that the electrical apparatus 50A is anomalous by notifying the user or the administrator of an anomaly in the electrical apparatus 50A or displaying information on the anomaly in the electrical apparatus 50A. Note that a warning to the effect that there is an anomaly may be provided by, for example, buzzer sound, lighting of a lamp, or information shown on a display of a remote controller. In addition, in a case where the electrical apparatus 50A is communicably connected to an information terminal such as a smartphone, notification of the anomaly may be provided to the information terminal. Furthermore, in a case where the electrical apparatus 50A is an air conditioner which is communicably connected to a management company via the Internet, notification of the anomaly may be provided to the management company.

Note that, in a case where the electrical apparatus 50A has a structure in which current flows through the electrical wire 17 not only while the electrical apparatus 50A is in operation but also while the electrical apparatus 50A is not in operation, whether the ground wire is connected or not is determined even while the electrical apparatus 50A is not in operation.

As described above, the electrical apparatus according to the second embodiment includes a second grounding conductor for electrically connecting the housing and the substrate. The detector is configured to detect a physical quantity correlated with a current flowing through the second grounding conductor. The housing accommodates a terminal block that receives a power supply voltage, and applies the power supply voltage to the substrate. With such a configuration, the electrical apparatus according to the second embodiment accurately and reliably senses the connection status of the ground wire of the electrical apparatus. In addition, the electrical apparatus according to the second embodiment configured as described above eliminates the need for a leakage current circuit breaker that may be provided in the conventional technique. In addition, the electrical apparatus according to the second embodiment eliminates the need for an additional circuit such as a high-frequency generation circuit required in the conventional technique. It is thus possible to prevent occurrence of a failure event in which the connection status of the ground wire cannot be accurately sensed due to an anomaly in the additional circuit. This makes it possible to obtain an electrical apparatus capable of accurately and reliably sensing the connection status of a ground wire of the electrical apparatus while suppressing an increase in manufacturing cost.

Furthermore, when a value detected by the detector is larger than the threshold, or when the value detected by the detector has changed to exceed or fall below the threshold, the electrical apparatus according to the second embodiment stops operation, or provides notification to the effect that the electrical apparatus is anomalous. As a result, the electrical apparatus is safely stopped, and information on the failure in ground wire connection is provided to the user or the administrator.

Third Embodiment

Figure 11:
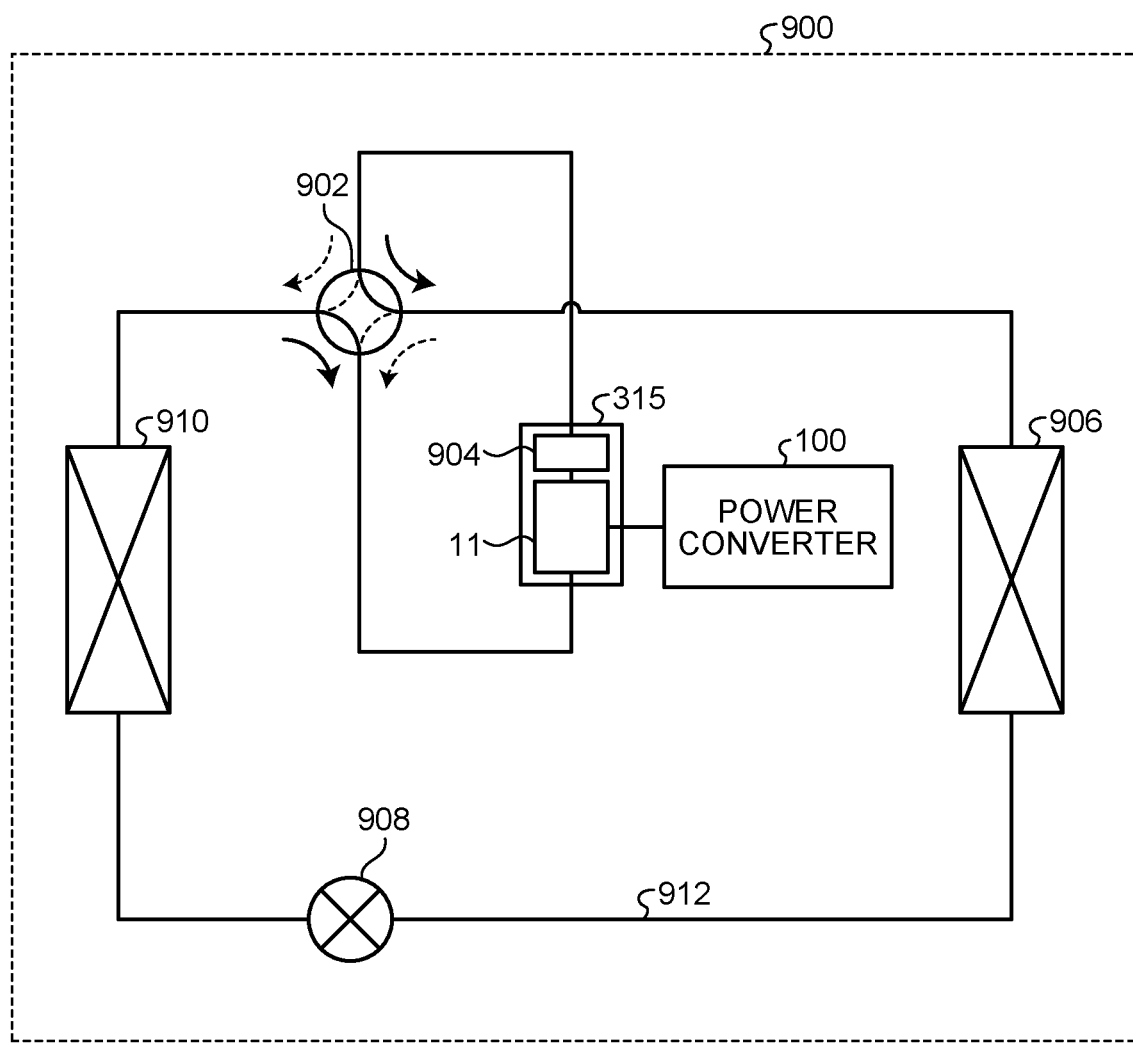
FIG. 11 is a diagram illustrating a configuration example of a refrigeration cycler according to a third embodiment.

FIG. 11 is a diagram illustrating a configuration example of a refrigeration cycler 900 according to a third embodiment. The refrigeration cycler 900 according to the third embodiment includes the power converter 100 described in the first embodiment. The refrigeration cycler 900 according to the third embodiment is applicable to a product having a refrigeration cycle, such as an air conditioner, a refrigerator, a freezer, or a heat pump water heater.

The refrigeration cycler 900 includes: a compressor 315 including the motor 11 according to the first embodiment; a four-way valve 902; an indoor heat exchanger 906; an expansion valve 908; and an outdoor heat exchanger 910, which are installed via a refrigerant pipe 912.

A compression mechanism 904 and the motor 11 are provided inside the compressor 315. The compression mechanism 904 compresses a refrigerant. The motor 11 causes the compression mechanism 904 to operate.

The refrigeration cycler 900 can perform heating operation or cooling operation according to switching operation of the four-way valve 902. The compression mechanism 904 is driven by the motor 11 that is under variable speed control.

During the heating operation, the refrigerant is pressurized by the compression mechanism 904 and delivered therefrom, passes through the four-way valve 902, the indoor heat exchanger 906, the expansion valve 908, the outdoor heat exchanger 910, and the four-way valve 902, and returns to the compression mechanism 904, as indicated by solid arrows.

During the cooling operation, the refrigerant is pressurized by the compression mechanism 904 and delivered therefrom, passes through the four-way valve 902, the outdoor heat exchanger 910, the expansion valve 908, the indoor heat exchanger 906, and the four-way valve 902, and returns to the compression mechanism 904, as indicated by broken arrows.

During the heating operation, the indoor heat exchanger 906 acts as a condenser to release heat, and the outdoor heat exchanger 910 acts as an evaporator to absorb heat. During the cooling operation, the outdoor heat exchanger 910 acts as a condenser to release heat, and the indoor heat exchanger 906 acts as an evaporator to absorb heat. The expansion valve 908 decompresses and expands the refrigerant.

Examples of the refrigerant to be used in the refrigeration cycler 900 include R1234yf, R1234ze(E), R1243zf, HFO1123, HFO1132 (E), R1132a, CF3I, R290, R463A, R466A, R454A, R454B, and R454C. Note that since the internal capacity component of the compressor 315 varies depending on the type of refrigerant, there is a correlation between the type of refrigerant and the common mode currents 4 and 4'. Therefore, it is desirable to examine the correlation between the type of refrigerant and the common mode currents 4 and 4' in advance.

It is possible to install the electrical apparatus 50 according to the first embodiment and the electrical apparatus 50A according to the second embodiment in the refrigeration cycler 900 according to the third embodiment. Thus, the refrigeration cycler 900 can enjoy the effects to be obtained in the first embodiment and the second embodiment.

Note that the refrigerant to be used in the refrigeration cycler 900 according to the third embodiment is exemplified by R1234yf, R1234ze(E), R1243zf, HFO1123, HFO1132 (E), R1132a, CF3I, R290, R463A, R466A, R454A, R454B, and R454C described above. These refrigerants are used for many purposes, and it is useful to acquire capacity components related to these refrigerants in advance. In this way, an appropriate threshold can be set according to the type of refrigerant. Thus, it is possible to contribute to improvement of sensing accuracy of sensing whether the ground wire is connected.

The configurations set forth in the above embodiments show examples, and it is possible to combine the configurations with another known technique or combine the embodiments with each other, and is also possible to partially omit or change the configurations without departing from the scope of the present disclosure.

The invention claimed is:

1. An electrical apparatus having a function of sensing whether a ground wire, which connects a terminal block and a midpoint of a power supply, is connected or not, the electrical apparatus comprising:
 a substrate on which circuit components, including an inverter circuit, of a power converter configured to perform power conversion are mounted, and to which a power supply voltage is applied from the power supply;
 a housing configured to accommodate the substrate;
 a detector configured to detect a physical quantity correlated with a common mode current, the common mode current flowing to circulate through at least two of the power supply, the substrate, and the housing by power generated by the inverter circuit of the power converter; and
 a sensor configured to sense whether the ground wire is connected or not, on a basis of a value detected by the detector, wherein
 the ground wire is an electrical wire adapted and configured to be installed when an installer performs wiring work.

2. The electrical apparatus according to claim 1, comprising:
 a first grounding conductor configured to electrically connect the housing and the power supply, wherein
 the detector is configured to detect a physical quantity correlated with a current flowing through the first grounding conductor.

3. The electrical apparatus according to claim 2, wherein
 the housing is configured to accommodate the terminal block, and the terminal block is configured to receive the power supply voltage and apply the power supply voltage to the substrate, and
 the first grounding conductor is disposed in such a way as to electrically connect the housing and the power supply via the terminal block.

4. The electrical apparatus according to claim 2, wherein
 when the value detected by the detector is zero, the electrical apparatus is configured to stop operation of the electrical apparatus, or notify an anomaly of the electrical apparatus.

5. The electrical apparatus according to claim 1, comprising:
 a second grounding conductor configured to electrically connect the housing and the substrate, wherein
 the detector is configured to detect a physical quantity correlated with a current flowing through the second grounding conductor.

6. The electrical apparatus according to claim 5, wherein
 a noise filter is mounted on the substrate, and includes a Y-capacitor, and
 the second grounding conductor is disposed between the housing and the Y-capacitor.

7. The electrical apparatus according to claim 5, wherein
 when the value detected by the detector is larger than a threshold, or when the value detected by the detector has changed to exceed or fall below the threshold, the electrical apparatus is configured to stop the operation of the electrical apparatus, or notify an anomaly in the electrical apparatus.

8. A refrigeration cycler comprising the electrical apparatus according to claim 1.

9. The refrigeration cycler according to claim 8, wherein a refrigerant to be used in the refrigeration cycler is any of R1234yf, R1234ze (E), R1243zf, HFO1123, HFO1132 (E), R1132a, CF3I, R290, R463A, R466A, R454A, R454B, and R454C.

* * * * *